United States Patent
Hunks et al.

(10) Patent No.: US 10,043,658 B2
(45) Date of Patent: Aug. 7, 2018

(54) PRECURSORS FOR SILICON DIOXIDE GAP FILL

(71) Applicant: Entegris, Inc., Billerica, MA (US)

(72) Inventors: William Hunks, Danbury, CT (US); Chongying Xu, Suzhou (CN); Bryan C. Hendrix, Danbury, CT (US); Jeffrey F. Roeder, Brookfield, CT (US); Steven M. Bilodeau, Oxford, CT (US); Weimin Li, New Milford, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/862,205

(22) Filed: Jan. 4, 2018

(65) Prior Publication Data

US 2018/0130654 A1 May 10, 2018

Related U.S. Application Data

(60) Continuation of application No. 15/093,865, filed on Apr. 8, 2016, which is a division of application No. (Continued)

(51) Int. Cl.
*H01L 21/02* (2006.01)
*H01L 29/06* (2006.01)

(52) U.S. Cl.
CPC .. *H01L 21/02211* (2013.01); *H01L 21/02123* (2013.01); *H01L 21/02164* (2013.01);
(Continued)

(58) Field of Classification Search
CPC .......... H01L 21/02211; H01L 29/0649; H01L 21/02222; H01L 21/02216;
(Continued)

(56) References Cited

U.S. PATENT DOCUMENTS 4,960,916 A 10/1990 Pazik
4,962,214 A 10/1990 Villacorta et al.
(Continued)

FOREIGN PATENT DOCUMENTS

JP 6069196 A 3/1994
KR 1020040075089 A 8/2004
(Continued)

OTHER PUBLICATIONS

Chang, C., et al., "Trench Filling Characteristics of Low Stress TEOS/Ozone Oxide Deposited by PECVD and SACVD", "Microsystem Technologies", Jan. 2004, pp. 97-102, vol. 10, No. 2.
(Continued)

*Primary Examiner* — John P Dulka
(74) *Attorney, Agent, or Firm* — Entegris, Inc.

(57) ABSTRACT

A full fill trench structure is described, including a microelectronic device substrate having a high aspect ratio trench therein and filled with silicon dioxide of a substantially void-free character and substantially uniform density throughout its bulk mass. A method of manufacturing a semiconductor product also is described, involving use of specific silicon precursor compositions for forming substantially void-free and substantially uniform density silicon dioxide material in the trench. The precursor fill composition may include silicon and germanium, to produce a microelectronic device structure including a $GeO_2/SiO_2$ trench fill material. A suppressor component may be employed in the precursor fill composition, to eliminate or minimize seam formation in the cured trench fill material.

16 Claims, 2 Drawing Sheets

Related U.S. Application Data

12/665,929, filed as application No. PCT/US2008/068521 on Jun. 27, 2008, now Pat. No. 9,337,054.

(60) Provisional application No. 61/055,809, filed on May 23, 2008, provisional application No. 60/946,968, filed on Jun. 28, 2007.

(52) U.S. Cl.
CPC .. *H01L 21/02216* (2013.01); *H01L 21/02222* (2013.01); *H01L 21/02263* (2013.01); *H01L 29/0649* (2013.01)

(58) Field of Classification Search
CPC ......... H01L 21/02123; H01L 21/02263; H01L 21/02164
See application file for complete search history.

(56) References Cited

U.S. PATENT DOCUMENTS

| | | | |
|---|---|---|---|
| 5,324,539 A | 6/1994 | Maeda et al. | |
| 5,453,494 A | 9/1995 | Kirlin et al. | |
| 5,626,924 A | 5/1997 | Ishikawa | |
| 5,648,175 A | 7/1997 | Russell et al. | |
| 6,077,786 A * | 6/2000 | Chakravarti | H01L 21/02129 216/37 |
| 6,331,494 B1 | 12/2001 | Olson et al. | |
| 6,376,391 B1 | 4/2002 | Olson et al. | |
| 6,646,122 B1 | 11/2003 | Nuhlen et al. | |
| 6,736,993 B1 | 5/2004 | Xu et al. | |
| 6,777,308 B2 | 8/2004 | Li et al. | |
| 6,787,186 B1 | 9/2004 | Hintermaier | |
| 6,858,516 B2 * | 2/2005 | Ho | H01L 21/76224 257/E21.546 |
| 6,914,015 B2 | 7/2005 | Belyansky et al. | |
| 6,946,359 B2 * | 9/2005 | Yang | H01L 21/76232 257/E21.244 |
| 6,984,591 B1 | 1/2006 | Buchanan et al. | |
| 7,018,908 B2 | 3/2006 | Sharan et al. | |
| 7,022,864 B2 | 4/2006 | Borovik et al. | |
| 7,060,638 B2 | 6/2006 | Nguyen et al. | |
| 7,084,080 B2 | 8/2006 | Borovik et al. | |
| 7,115,927 B2 | 10/2006 | Hideki et al. | |
| 7,176,105 B2 * | 2/2007 | Nemani | H01L 21/76229 257/E21.548 |
| 7,371,429 B2 | 5/2008 | Lee et al. | |
| 7,402,851 B2 | 7/2008 | Hideki et al. | |
| 7,423,166 B2 | 9/2008 | Chen et al. | |
| 7,425,735 B2 | 9/2008 | Park et al. | |
| 7,446,217 B2 | 11/2008 | Wang et al. | |
| 7,462,900 B2 | 12/2008 | Hideki et al. | |
| 7,476,917 B2 | 1/2009 | Hideki et al. | |
| 7,531,679 B2 | 5/2009 | Wang et al. | |
| 7,582,561 B2 | 9/2009 | Wai et al. | |
| 7,615,401 B2 | 11/2009 | Park et al. | |
| 7,704,787 B2 | 4/2010 | Hideki et al. | |
| 7,728,172 B2 | 6/2010 | Lee et al. | |
| 7,781,605 B2 | 8/2010 | Wang et al. | |
| 7,786,320 B2 | 8/2010 | Wang et al. | |
| 7,863,203 B2 | 1/2011 | Wang et al. | |
| 2002/0004266 A1 | 1/2002 | Hashimoto et al. | |
| 2002/0090815 A1 | 7/2002 | Koike et al. | |
| 2003/0116421 A1 | 6/2003 | Xu et al. | |
| 2003/0201243 A1 | 10/2003 | Sun et al. | |
| 2004/0038808 A1 | 2/2004 | Hampden-Smith et al. | |
| 2004/0039219 A1 | 2/2004 | Chen et al. | |
| 2004/0096582 A1 | 5/2004 | Wang et al. | |
| 2005/0035464 A1 | 2/2005 | Ho et al. | |
| 2005/0080285 A1 | 4/2005 | Wang et al. | |
| 2005/0080286 A1 | 4/2005 | Wang et al. | |
| 2005/0145918 A1 | 7/2005 | Gealy et al. | |
| 2005/0169580 A1 | 8/2005 | Takahashi et al. | |
| 2005/0208699 A1 | 9/2005 | Furkay et al. | |
| 2005/0255712 A1 | 11/2005 | Kato et al. | |
| 2005/0266700 A1 | 12/2005 | Jursich et al. | |
| 2006/0006449 A1 | 1/2006 | Jeong et al. | |
| 2006/0027451 A1 | 2/2006 | Park et al. | |
| 2006/0035462 A1 | 2/2006 | Millward | |
| 2006/0049447 A1 | 3/2006 | Lee et al. | |
| 2006/0099831 A1 | 5/2006 | Borovik et al. | |
| 2006/0113622 A1 | 6/2006 | Adkisson et al. | |
| 2006/0115595 A1 | 6/2006 | Shenai-Khatkhate et al. | |
| 2006/0134897 A1 | 6/2006 | Borovik et al. | |
| 2006/0138393 A1 | 6/2006 | Seo et al. | |
| 2006/0141155 A1 | 6/2006 | Gordon et al. | |
| 2006/0148271 A1 | 7/2006 | Borovik et al. | |
| 2006/0172067 A1 | 8/2006 | Ovshinsky et al. | |
| 2006/0172083 A1 | 8/2006 | Lee et al. | |
| 2006/0178003 A1 | 8/2006 | Krishnaraj et al. | |
| 2006/0180811 A1 | 8/2006 | Lee et al. | |
| 2007/0054505 A1 | 3/2007 | Antonelli et al. | |
| 2007/0154637 A1 | 7/2007 | Shenai-Khatkhate et al. | |
| 2007/0155931 A1 | 7/2007 | Borovik et al. | |
| 2007/0160760 A1 | 7/2007 | Shin et al. | |
| 2008/0048148 A1 | 2/2008 | Borovik et al. | |
| 2008/0160174 A1 | 7/2008 | Wang et al. | |
| 2009/0084288 A1 | 4/2009 | Wang et al. | |
| 2009/0087561 A1 | 4/2009 | Chen et al. | |
| 2009/0112009 A1 | 4/2009 | Chen et al. | |
| 2009/0124039 A1 | 5/2009 | Roeder et al. | |
| 2009/0275164 A1 | 11/2009 | Chen et al. | |
| 2009/0305458 A1 | 12/2009 | Hunks et al. | |
| 2010/0112211 A1 | 5/2010 | Xu et al. | |
| 2011/0060165 A1 | 3/2011 | Cameron et al. | |

FOREIGN PATENT DOCUMENTS

| | | |
|---|---|---|
| WO | 03063205 A2 | 7/2003 |
| WO | 2005085175 A1 | 9/2005 |

OTHER PUBLICATIONS

Chen, L., et al., "Crystalline silicon carbon nitride: A wide band gap semiconductor", "Appl. Phys. Letters.", May 11, 1998, pp. 2463-2465, vol. 72, No. 19.

Chen, T., et al., "Low temperature Deposition of Ge Thin Films with a Ge(II) Silylamido Source", "ECS Transactions", 2007, pp. 269-278, vol. 11, No. 7.

Maeda, M., et al., "Effect of Added Ethanol in Atmospheric-Pressure Chemical Vapor Deposition Reaction Using Tetraethoxysilane and Ozone", "Jpn. J. Appl. Phys.", May 1994, pp. 2703-2707, vol. 33.

Nguyen, S.V., "High-density Plasma Chemical Vapor Deposition of Silicon-based Dielectric Films for Integrated Circuits", "IBM Journal of Research and Development", Jan. 1999, pp. 109-126, vol. 43, No. 1/2.

Shareef, I., et al., "Subatmospheric chemical vapor deposition ozone/TEOS process for SIO2 trench filling", "Journal of Vacuum Science & Technology B: Microelectronics and Nanometer Structures", Jul. 1995, pp. 1888-1892, vol. 13, No. 4.

* cited by examiner

PRECURSORS FOR SILICON DIOXIDE GAP FILL

CROSS-REFERENCE TO RELATED APPLICATIONS

This application is a continuation of U.S. patent application Ser. No. 15/093,865, filed Apr. 8, 2016, which is a divisional application of U.S. patent application Ser. No. 12/665,929, filed Dec. 21, 2009 (371(c) date, Feb. 5, 2010), now U.S. Pat. No. 9,337,054, which is a U.S. national phase under the provisions of 35 U.S.C. § 371 of International Application No. PCT/US08/68521 filed Jun. 27, 2008, which in turn claims the benefit of priority under 35 U.S.C. § 119 of U.S. Provisional Patent Application No. 60/946,968 filed Jun. 28, 2007 and U.S. Provisional Patent Application No. 61/055,809 filed May 23, 2008, the disclosures of each are hereby incorporated herein by reference, in their respective entireties, for all purposes.

FIELD OF THE INVENTION

The present invention relates to trench structures of microelectronic devices and methods for fabricating same, and to precursors having utility for forming silicon dioxide full-fill high aspect ratio trench structures in which the silicon dioxide precursor is flow filled in the trench and cures rapidly at low temperature to form silicon dioxide of a substantially void-free condition with substantially uniform density throughout its bulk volume.

DESCRIPTION OF THE RELATED ART

As dimensions in integrated circuits continue to decrease, correspondingly narrower trenches with increasing aspect ratios are required. Current processes to deposit silicon dioxide in trenches employ chemical vapor deposition. However, with technology nodes decreasing to below 65 nm, it becomes progressively more difficult to deposit silicon dioxide in narrow trenches without introducing voids in the deposited material.

Faced with such difficulty, a low-temperature flow-fill method in a controlled humidity environment or with an oxidant co-reactant is desired for curing, since elevated temperature hydrolysis and condensation reactions are prone to form voids and cracks in the product silicon dioxide material. Voids, cracks, and other defects in turn create inhomogenieties in the dielectric material that adversely affect device performance. A condensed matrix material that exhibits low shrinkage during thermal curing therefore is necessary in order to prevent cracking.

Uniform material densification in the narrow trenches is also a problem with conventionally available silicon dioxide precursors due to diffusion-limited oxidation that occurs during their curing.

Normally a high temperature (600-1200° C.) thermal anneal stage is used to form $SiO_2$. A low temperature process is preferred, due to high temperature incompatibilities with other structures, materials, and processes in the integrated circuit or memory device that lead to a degraded device with poor performance when high temperature annealing is employed. Further, high temperature annealing increases the overall thermal budget of the process, and is disadvantageous for such reason.

Conventional precursors used in the art to form oxide layers in semiconductors, which are characterized by the aforementioned problems, include: silane or methylsilane, as cured with hydrogen peroxide; polysilazane, as cured with ozone or oxic plasma; tetraethylorthosilicate, as cured with water; and hexachlorodisilane (HCDS), as cured with pyridine and water.

Although certain alkoxysilanes, such as triethoxysilane, have been utilized as silicon dioxide precursors, such precursors hydrolyze slowly in moist air and the condensation rate of silica at neutral pH is relatively slow. Precursors with hydrolyzable or labile groups can induce crosslinking, thereby generating a dense $SiO_2$ matrix with improved density, increased mechanical strength, and enhanced CMP (chemical mechanical polishing) and HF etch resistances. Even though water vapor annealing is effective for densifying the oxide film, in some integrations in which the transistor is formed before the isolation material is deposited, water annealing has the significant drawback that it causes oxidation around the transistor that degrades performance.

One possible composition for fill of memory device trenches is tetraethylorthosilicate (TEOS) as cured thermally with ozone, which holds the potential for achieving extremely conformal films. Such TEOS/ozone process, however, has the substantial deficiency that while the resultant composition can be made to fully fill the trench, it inherently leaves a seam where the growths from the trench sidewalls meet one another. This seam is a common weak region with enhanced removal rates when exposed to cleaning chemistries in subsequent device processing.

A precursor that can be flow-filled and hydrolyzed rapidly at low temperatures, then quickly condensed to form dense $SiO_2$ in the trench before the formation of a skin layer, would achieve a substantial advance in the art.

Another issue related to such trench filling is that although water vapor annealing

SUMMARY OF THE INVENTION

The present invention relates to microelectronic device trench structures and fabrication methods therefor, and silicon dioxide precursors suitable for forming silicon dioxide full-fill high aspect ratio trench structures in which the precursor is flow filled in the trench and cures rapidly at low temperature to form silicon dioxide of a substantially void-free condition with substantially uniform density throughout its bulk volume.

In one aspect, the invention relates to a full fill trench structure comprising a microelectronic device substrate having a high aspect ratio trench therein and a full filled mass of silicon dioxide in said trench, said silicon dioxide being of a substantially void-free character and having a substantially uniform density throughout its bulk mass.

In another aspect, the invention relates to a method of manufacturing a semiconductor product, including providing a microelectronic device substrate having a trench therein, and full filling the trench with a silicon dioxide precursor composition, and processing the silicon dioxide precursor composition to form a full fill mass of silicon dioxide in the trench, wherein the silicon dioxide precursor composition comprises a precursor silicon compound selected from the group consisting of:

(i) aminosilanes of the formula $(R^1R^2N)_{4-x}SiR_x$, wherein x is an integer having a value in a range of from 0 to 3, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(ii) alkoxysilanes of the formula $(RO)_{4-x}SiR_x$, wherein x is an integer having a value in a range of from 0 to 3, and each R and $R^1$ is independently selected from among hydrogen, branched and unbranched $C_1$-$C_6$ alkyl, $C_3$-$C_8$ cycloalkyl, and $C_6$-$C_{13}$ aryl;

(iii) alkoxydisilanes of the formula $(RO)_{3-x}R^1_xSi$—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(iv) aminodisilanes of the formula $(R^1R^2N)_{3-x}R_xSi$—$Si(NR^1R^2)_{3-x}R_x$, wherein x is an integer having a value in a range of from 0 to 2, and each R, $R^1$, and $R^2$ is independently selected from among hydrogen, branched or unbranched $C_1$-$C_6$ alkyl, $C_3$-$C_8$ cycloalkyl, and $C_6$-$C_{13}$ aryl;

(v) aminodisiloxanes of the formula $(R^1R^2N)_{3-x}R_xSi$—$O$—$Si(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(vi) alkoxydisiloxanes of the formula $(RO)_{3-x}R^1_xSi$—$O$—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(vii) aminodisilazanes of the formula $(R^1R^2N)_{3-x}R_xSi$—$NH$—$Si(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(viii) alkoxydisilazanes of the formula $(RO)_{3-x}R^1_xSi$—$NH$—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(ix) chloroaminosilanes of the formulae $Cl_{4-x}Si(NR^1R^2)_x$, wherein x is an integer having a value in a range of from 0 to 3, $(R^1R^2N)_{3-x}Cl_xSi$—$Si(NR^1R^2)_{3-x}Cl_x$, wherein x is an integer having a value of 1 or 2, $(R^1R^2N)_{3-x}Cl_xSi$—$O$—$Si(NR^1R^2)_{3-x}Cl_x$, wherein x is an integer having a value of 1 or 2, and $(R^1R^2N)_{3-x}Cl_xSi$—$NH$—$Si(NR^1R^2)_{3-x}Cl_x$, wherein x is an integer having a value of from 1 or 2, and each $R^1$ and $R^2$ is independently selected from among hydrogen, branched and unbranched $C_1$-$C_6$ alkyl, $C_3$-$C_8$ cycloalkyl, and $C_6$-$C_{13}$ aryl;

(x) cyclosiloxanes and cyclosilazanes of the formulae:

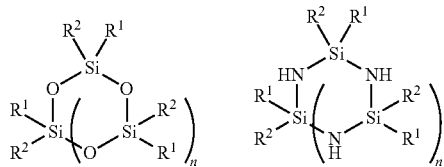

wherein n is an integer having a value in the range of from 0 to 4, and each $R^1$ and $R^2$ is selected from among hydrogen, branched and unbranched $C_1$-$C_6$ alkyl, $C_3$-$C_8$ cycloalkyl, $C_6$-$C_{13}$ aryl, $C_1$-$C_6$ dialkylamino, and $C_1$-$C_6$ alkoxide;

(xi) linear polysiloxanes and polysilazanes;

(xii) silicon compounds of general formulae $R_{4-x}SiL_x$ wherein x is an integer having a value of from 1 to 3, and $L_{3-x}R_xSi$-$SiL_{3-x}R_x$ wherein x is an integer having a value of from 0 to 2, L is selected from isocyanato (NCO), methylethylketoxime ($R^1R^2C$=$N$—$O$—), trifluoroacetate ($CF_3OCO$), triflate ($CF_3SO_3$), acyloxy (ROCO), β-diketonate ($R^1COCHCOR^2$), β-diketiminate ($R^1CNR^2CHCOR^3$), β-diiminate ($R^1CNR^2CHCNR^2R^3$), amidinate ($RC(NR^1)_2$), guanidinate $\{(R^1R^2N)C(NR^3)_2\}$, alkylamino ($NR^1R^2$), hydride, alkoxide (RO), and formato (HCOO) and each R, $R^1$, $R^2$, and $R^3$ is independently selected from among hydrogen, branched and unbranched $C_1$-$C_6$ alkyl, $C_3$-$C_8$ cycloalkyl, and $C_6$-$C_{13}$ aryl;

(xiii) oxiranylsilanes of the formulae

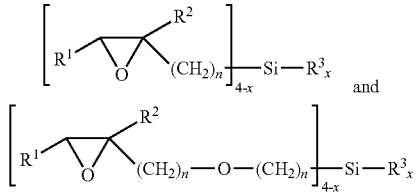

wherein x is an integer having a value in a range of from 0 to 3, n is an integer having a value in a range of 0 to 3, and each $R^1$, $R^2$, and $R^3$ is independently selected from among hydrogen, branched and unbranched $C_1$-$C_6$ alkyl, $C_3$-$C_8$ cycloalkyl, $C_6$-$C_{13}$ aryl, $C_1$-$C_6$ alkylamino, and $C_1$-$C_6$ alkoxide;

(xiv) silicon precursors containing ethylacetate groups, of the formula $(ROCOCH_2CH_2)_xSi(OR^1)_{4-x}$, wherein x is an integer having a value in a range of from 1 to 4, and each of R and $R^1$ is independently selected from among hydrogen, branched and unbranched $C_1$-$C_6$ alkyl, $C_3$-$C_8$ cycloalkyl, and $C_6$-$C_{13}$ aryl;

(xv) $(tBuHN)_2(H_2N)Si$—$Si(NH_2)(NHtBu)_2$ wherein tBu is tertiary butyl; and (xvi) pre-polymer partial hydrolysis products of the foregoing compounds (i)-(xv).

In a still further aspect, the invention relates to a method of depositing silicon dioxide on a substrate, comprising contacting a substrate with a vapor of a precursor silicon compound selected from the group consisting of:

(i) aminosilanes of the formula $(R^1R^2N)_{4-x}SiR_x$, wherein x is an integer having a value in a range of from 0 to 3, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(ii) alkoxysilanes of the formula $(RO)_{4-x}SiR^1_x$, wherein x is an integer having a value in a range of from 0 to 3, and each R and $R^1$ is independently selected from among hydrogen, branched and unbranched $C_1$-$C_6$ alkyl, $C_3$-$C_8$ cycloalkyl, and $C_6$-$C_{13}$ aryl;

(iii) alkoxydisilanes of the formula $(RO)_{3-x}R^1_xSi$—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(iv) aminodisilanes of the formula $(R^1R^2N)_{3-x}R_xSi$—$Si(NR^1R^2)_{3-x}R_x$, wherein x is an integer having a value in a range of from 0 to 2, and each R, $R^1$, and $R^2$ is independently selected from among hydrogen, branched or unbranched $C_1$-$C_6$ alkyl, $C_3$-$C_8$ cycloalkyl, and $C_6$-$C_{13}$ aryl;

(v) aminodisiloxanes of the formula $(R^1R^2N)_{3-x}R_xSi$—$O$—$Si(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(vi) alkoxydisiloxanes of the formula $(RO)_{3-x}R^1_xSi$—$O$—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(vii) aminodisilazanes of the formula $(R^1R^2N)_{3-x}R_xSi$—NH—$Si(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(viii) alkoxydisilazanes of the formula $(RO)_{3-x}R^1_xSi$—NH—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(ix) chloroaminosilanes of the formulae $Cl_{4-x}Si(NR^1R^2)_x$, wherein x is an integer having a value in a range of from 0 to 3, $(R^1R^2N)_{3-x}Cl_xSi$—$Si(NR^1R^2)_{3-x}Cl_x$, wherein x is an integer having a value of 1 or 2, $(R^1R^2N)_{3-x}Cl_xSi$—O—$Si(NR^1R^2)_{3-x}Cl_x$, wherein x is an integer having a value of 1 or 2, and $(R^1R^2N)_{3-x}Cl_xSi$—NH—$Si(NR^1R^2)_{3-x}Cl_x$, wherein x is an integer having a value of from 1 or 2, and each $R^1$ and $R^2$ is independently selected from among hydrogen, branched and unbranched $C_1$-$C_6$ alkyl, $C_3$-$C_8$ cycloalkyl, and $C_6$-$C_{13}$ aryl;

(x) cyclosiloxanes and cyclosilazanes of the formulae:

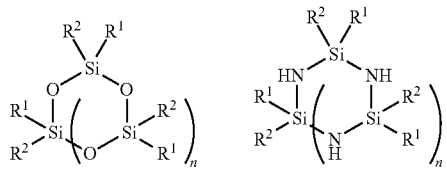

wherein n is an integer having a value in the range of from 0 to 4, and each $R^1$ and $R^2$ is selected from among hydrogen, branched and unbranched $C_1$-$C_6$ alkyl, $C_3$-$C_8$ cycloalkyl, $C_6$-$C_{13}$ aryl, $C_1$-$C_6$ dialkylamino, and $C_1$-$C_6$ alkoxide;

(xi) linear polysiloxanes and polysilazanes;

(xii) silicon compounds of general formulae $R_{4-x}SiL_x$ wherein x is an integer having a value of from 1 to 3, and $L_{3-x}R_xSi$-$SiL_{3-x}R_x$ wherein x is an integer having a value of from 0 to 2, L is selected from isocyanato (NCO), methylethylketoxime $(R^1R^2C=N-O-)$, trifluoroacetate $(CF_3OCO)$, triflate $(CF_3SO_3)$, acyloxy (ROCO), β-diketonate $(R^1COCHCOR^2)$, β-diketiminate $(R^1CNR^2CHCOR^3)$, β-diiminate $(R^1CNR^2CHCNR^2R^3)$, amidinate $(RC(NR^1)_2)$, guanidinate $\{(R^1R^2N)C(NR^3)_2\}$, alkylamino $(NR^1R^2)$, hydride, alkoxide (RO), and formato (HCOO) and each R, $R^1$, $R^2$, and $R^3$ is independently selected from among hydrogen, branched and unbranched $C_1$-$C_6$ alkyl, $C_3$-$C_8$ cycloalkyl, and $C_6$-$C_{13}$ aryl;

(xiii) oxiranylsilanes of the formulae

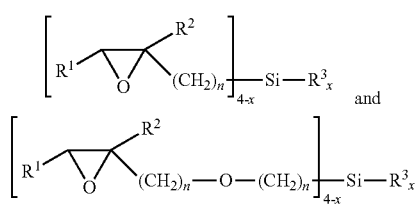

wherein x is an integer having a value in a range of from 0 to 3, n is an integer having a value in a range of 0 to 3, and each $R^1$, $R^2$, and $R^3$ is independently selected from among hydrogen, branched and unbranched $C_1$-$C_6$ alkyl, $C_3$-$C_8$ cycloalkyl, $C_6$-$C_{13}$ aryl, $C_1$-$C_6$ alkylamino, and $C_1$-$C_6$ alkoxide;

(xiv) silicon precursors containing ethylacetate groups, of the formula $(ROCOCH_2CH_2)_xSi(OR^1)_{4-x}$, wherein x is an integer having a value in a range of from 1 to 4, and each of R and $R^1$ is independently selected from among hydrogen, branched and unbranched $C_1$-$C_6$ alkyl, $C_3$-$C_8$ cycloalkyl, and $C_6$-$C_{13}$ aryl;

(xv) $(tBuHN)_2(H_2N)Si$—$Si(NH_2)(NHtBu)_2$ wherein tBu is tertiary butyl; and (xvi) pre-polymer partial hydrolysis products of the foregoing compounds (i)-(xv).

Another aspect of the invention relates to a method of forming an oxide material in a trench structure of a substrate for filling thereof, said method comprising depositing oxide precursor material on the substrate for filling of the trench structure, wherein the oxide precursor material comprises germanium and silicon.

A further aspect of the invention relates to a microelectronic device structure, comprising a substrate having a trench structure formed therein, wherein the trench structure is filled with a Ge/Si oxide composition.

In another aspect, the invention relates to a method of forming an oxide fill material in a trench, comprising depositing the oxide fill material from a precursor composition including a suppressor, to suppress seam formation.

Still another aspect of the invention relates to a method of suppressing adverse seam effects in fill of a trench structure of a substrate with a silicon material oxidizable to form silicon dioxide, said method comprising incorporating a germanium precursor in said silicon material.

The invention relates in another aspect to a microelectronic device structure, including a trench at least partially filled with a $GeO_2/SiO_2$ mixture.

Another aspect of the invention relates to a method of conducting a $TEOS/O_3$ process to fill a trench structure in a substrate, comprising adding a hydroxyl functional compound to said TEOS.

Yet another aspect of the invention relates to a method of filing a trench in a substrate, comprising carrying out a TEOS/ozone process to form silicon oxide material in the trench, with addition to the TEOS of an aldehyde.

A further aspect of the invention relates to a method of filing a trench in a substrate, comprising carrying out a TEOS/ozone process to form silicon oxide material in the trench, wherein TEOS is deposited in substrate in a composition comprising ethylene glycol and isopropyl alcohol.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
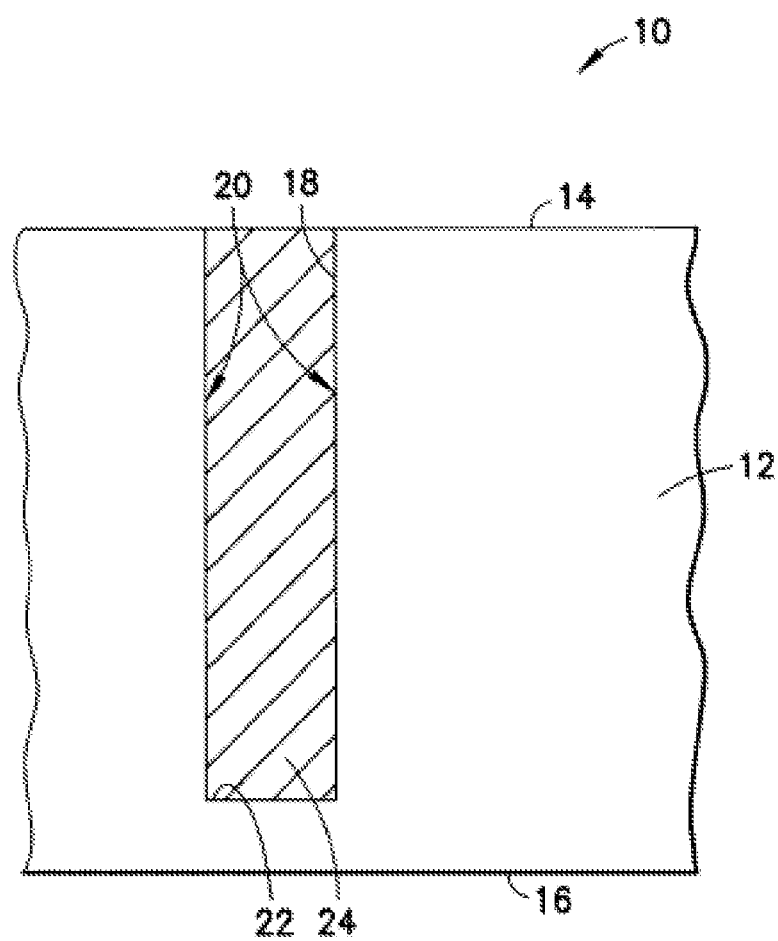
FIG. 1 is a schematic representation of a high aspect ratio trench structure in which the trench contains silicon dioxide formed from a precursor of the present invention that is cured under low temperature conditions to yield silicon dioxide of a substantially void-free condition with substantially uniform density throughout its bulk volume, in the trench.

The present invention relates variously to trench structures, and precursors and processes useful for forming such trench structures.

As used herein, "low temperature" means temperature below 400° C.

The term "flow fill" in reference to the precursor material of the present invention refers to material that in introduction to a high aspect ratio trench is self-leveling within the trench to form a bulk volume of the material in contact with the trench wall and floor surfaces.

The term "high aspect ratio" in reference to a trench in a microelectronic device substrate means a ratio of at least 3:1 of depth: width of the trench. In one preferred embodiment, the trench has a depth: width ratio in a range of from 3:1 to 10:1. In another preferred embodiment, the trench has a depth: width ratio of at least 5:1.

As used herein and in the appended claims, the singular forms "a", "and", and "the" include plural referents unless the context clearly dictates otherwise.

As used herein, the identification of a carbon number range, e.g., in $C_1$-$C_6$ alkyl, or $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_5$ alkyl, $C_2$-$C_4$ alkyl, $C_3$-$C_5$ alkyl, or any other sub-range within the broad carbon number range. It therefore is to be understood that any of the carbon numbers in the specified range may be selected as a respective lower limit or upper limit value of the number of carbon atoms in the specified substituent, so that all possible permutations of sub-ranges are to be regarded as being identically set forth herein.

In like manner, although a specific features, aspects, examples and embodiments are described in particular arrangements of the inventive subject matter, it is contemplated that such features, aspects, examples and/or embodiments may be selectively aggregated with one another, in permutations, combinations and sub-combinations thereof, within the contemplation and scope of the invention, and are to be regarded as being identically set forth herein.

The silicon dioxide precursors suitable for forming silicon dioxide full-fill high aspect ratio trench structures in the practice of the invention are flow fillable into high aspect trench structures and cure rapidly at low temperature to form silicon dioxide of a substantially void-free and crack-free condition with substantially uniform density throughout bulk volume of the cured silicon dioxide.

Precursors generally useful in the broad practice of the present invention include, without limitation, precursor silicon compounds selected from among the following:

(i) aminosilanes of the formula $(R^1R^2N)_{4-x}SiR_x$, wherein x is an integer having a value in a range of from 0 to 3, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(ii) alkoxysilanes of the formula $(RO)_{4-x}SiR^1_x$, wherein x is an integer having a value in a range of from 0 to 3, and each R and $R^1$ is independently selected from among hydrogen, branched and unbranched $C_1$-$C_6$ alkyl, $C_3$-$C_8$ cycloalkyl, and $C_6$-$C_{13}$ aryl;

(iii) alkoxydisilanes of the formula $(RO)_{3-x}R^1_xSi$—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(iv) aminodisilanes of the formula $(R^1R^2N)_{3-x}R_xSi$—$Si(NR^1R^2)_{3-x}R_x$, wherein x is an integer having a value in a range of from 0 to 2, and each R, $R^1$, and $R^2$ is independently selected from among hydrogen, branched or unbranched $C_1$-$C_6$ alkyl, $C_3$-$C_8$ cycloalkyl, and $C_6$-$C_{13}$ aryl;

(v) aminodisiloxanes of the formula $(R^1R^2N)_{3-x}R_xSi$—O—$Si(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(vi) alkoxydisiloxanes of the formula $(RO)_{3-x}R^1_xSi$—O—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(vii) aminodisilazanes of the formula $(R^1R^2N)_{3-x}R_xSi$—NH—$Si(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;

(viii) alkoxydisilazanes of the formula $(RO)_{3-x}R^1_xSi$—NH—$Si(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;

(ix) chloroaminosilanes of the formulae $Cl_{4-x}Si(NR^1R^2)_x$, wherein x is an integer having a value in a range of from 0 to 3, $(R^1R^2N)_{3-x}Cl_xSi$—$Si(NR^1R^2)_{3-x}Cl_x$, wherein x is an integer having a value of 1 or 2, $(R^1R^2N)_{3-x}Cl_xSi$—O—$Si(NR^1R^2)_{3-x}Cl_x$, wherein x is an integer having a value of 1 or 2, and $(R^1R^2N)_{3-x}Cl_xSi$—NH—$Si(NR^1R^2)_{3-x}Cl_x$, wherein x is an integer having a value of from 1 or 2, and each $R^1$ and $R^2$ is independently selected from among hydrogen, branched and unbranched $C_1$-$C_6$ alkyl, $C_3$-$C_8$ cycloalkyl, and $C_6$-$C_{13}$ aryl;

(x) cyclosiloxanes and cyclosilazanes of the formulae:

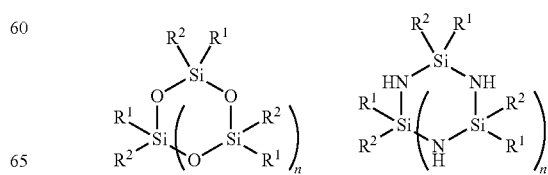

wherein n is an integer having a value in the range of from 0 to 4, and each $R^1$ and $R^2$ is selected from among hydrogen, branched and unbranched $C_1$-$C_6$ alkyl, $C_3$-$C_8$ cycloalkyl, $C_6$-$C_{13}$ aryl, $C_1$-$C_6$ dialkylamino, and $C_1$-$C_6$ alkoxide;

(xi) linear polysiloxanes and polysilazanes;

(xii) silicon compounds of general formulae $R_{4-x}SiL_x$ wherein x is an integer having a value of from 1 to 3, and $L_{3-x}R_xSi$-$SiL_{3-x}R_x$ wherein x is an integer having a value of from 0 to 2, L is selected from isocyanato (NCO), methylethylketoxime ($R^1R^2C{=}N{-}O{-}$), trifluoroacetate ($CF_3OCO$), triflate ($CF_3SO_3$), acyloxy (ROCO), β-diketonate ($R^1COCHCOR^2$), β-diketiminate ($R^1CNR^2CHCOR^3$), β-diiminate ($R^1CNR^2CHCNR^2R^3$), amidinate ($RC(NR^1)_2$), guanidinate $\{(R^1R^2N)C(NR^3)_2\}$, alkylamino ($NR^1R^2$), hydride, alkoxide (RO), and formato (HCOO) and each R, $R^1$, $R^2$, and $R^3$ is independently selected from among hydrogen, branched and unbranched $C_1$-$C_6$ alkyl, $C_3$-$C_8$ cycloalkyl, and $C_6$-$C_{13}$ aryl;

(xiii) oxiranylsilanes of the formulae

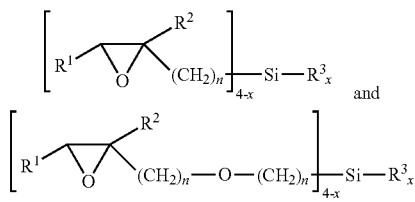

and wherein x is an integer having a value in a range of from 0 to 3, n is an integer having a value in a range of 0 to 3, and each $R^1$, $R^2$, and $R^3$ is independently selected from among hydrogen, branched and unbranched $C_1$-$C_6$ alkyl, $C_3$-$C_8$ cycloalkyl, $C_6$-$C_{13}$ aryl, $C_1$-$C_6$ alkylamino, and $C_1$-$C_6$ alkoxide;

(xiv) silicon precursors containing ethylacetate groups, of the formula $(ROCOCH_2CH_2)_xSi(OR^1)_{4-x}$, wherein x is an integer having a value in a range of from 1 to 4, and each of R and $R^1$ is independently selected from among hydrogen, branched and unbranched $C_1$-$C_6$ alkyl, $C_3$-$C_8$ cycloalkyl, and $C_6$-$C_{13}$ aryl;

(xv) $(tBuHN)_2(H_2N)Si$—$Si(NH_2)(NHtBu)_2$ wherein tBu is tertiary butyl; and (xvi) pre-polymer partial hydrolysis products of the foregoing compounds (i)-(xv).

The above precursor compounds are readily synthesized within the skill of the art, for use in precursor compositions and applications of the present invention.

The precursor compositions of the invention in one specific aspect include aminosilanes, which hydrolyze rapidly in exposure to moisture, water and protic solvents. Ammonia, amines and disilanes can be employed to catalyze the condensation reaction, in the curing of the precursor composition. Precursors that form silyl radicals or ligands that readily undergo thermal decomposition (e.g. formate via decarboxylation of $CO_2$) are also included.

In another specific aspect of the invention, precursor compositions are employed, which include those of the formulae: $(RO)_{4-x}SiH_x$, wherein x is an integer having a value of from 0 to 3, $H_{4-x}Si(NR_2)_x$, wherein x is an integer having a value of from 1 to 4, $H_{4-x}Si(NHR)_x$, wherein x is an integer having a value of from 1 to 4, $(RO)_{3-x}H_xSi$—$Si(OR)_{3-x}H_x$, wherein x is an integer having a value of from 0 to 2, $(NR^1R^2)_{3-x}H_xSi$—$Si(NR^1R^2)_{3-x}H_x$, wherein x is an integer having a value in a range of from 0 to 2, and each R, $R^1$, $R^2$ is independently selected from among hydrogen, and branched and unbranched $C_1$-$C_6$ alkyl.

In another aspect of the invention, precursor compositions are employed, which comprise silicon precursors in which the silicon atom is coordinated with ligands including at least one of isocyanato, methylethylketoxime, trifluoroacetate, triflate ($F_3SO_3H$), alkylamines, hydrides, alkoxides, disilanes, and formato. The resulting $Si(OH)_4$ sols can be condensed by various techniques, including for example: ammonia flow into the aqueous solution of the precursor; addition of co-reactants such as silicon tetrachloride, e.g., 0.05-5% $SiCl_4$, to an alkoxysilane (e.g., tetraethylorthosilicate (TEOS), dibutoxydiacetoxysilane (DBDAS), $(EtO)_3SiH$, etc.) to generate a small amount of an acid catalyst species; or addition of a silane (Si—H) or disilane (Si—Si) precursor such as hexaethylaminodisilane (HEADS).

Another approach to catalyzing condensation in a further aspect of the invention involves mixing a small amount of a chloroaminosilane, e.g., 0.05-5% $Cl_{4-x}Si(NR_2)_x$, wherein x is an integer having a value in a range of from 1 to 3, to the corresponding aminosilane $H_{4-x}Si(NR_2)_x$ wherein x has the same integer value of from 1 to 3.

In a similar manner, mixtures of chloro-substituted silanes and chloro-substituted disilanes can be added to alkoxysilane precursors in an amount, e.g., 0.05-5% by weight, based on the weight of the silicon dioxide precursor and the chloro compound, which is sufficient to generate catalytically effective species for the condensation reaction.

One preferred aminosilane precursor of the invention is hexaethylaminodisilane (HEADS), which rapidly condenses to $SiO_2$ in the presence of water or moisture. Other preferred alkylaminosilane precursors include $(tBuHN)_2(H_2N)Si$—$Si(NH_2)(NHtBu)_2$ and $Si(NMe_2)_4$.

One preferred group of silicon dioxide precursors of the invention includes the precursors (1)-(12) set forth below.

(1)

(2)

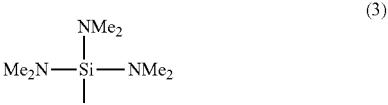

(3)

(4)

(5)

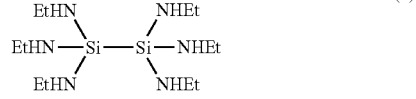

(6)

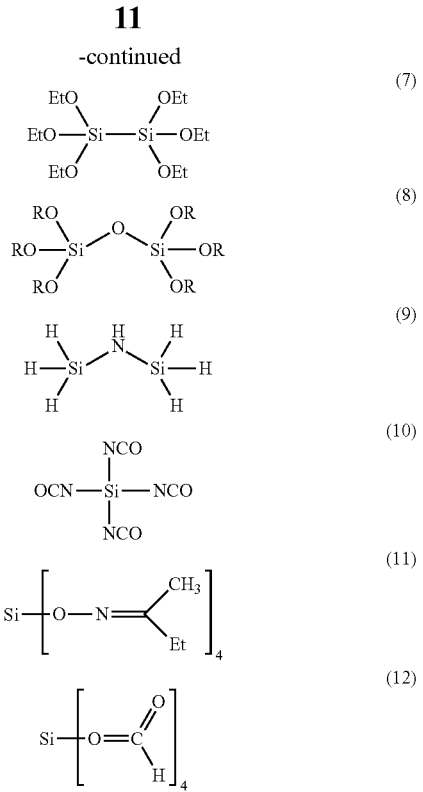

wherein OAc in formula (2) is acetoxy (CH$_3$C(O)O—), Me in formulae (3) and (4) is methyl, Et in formulae (1), (6), (7) and (11) is ethyl, tBu in formulae (2) and (5) is tertiary butyl, and R in the OR groups of formula (8) is branched or unbranched C$_1$-C$_6$ alkyl.

For efficient processing, the gap filling of the trench by flow fill techniques should be complete in a period of less than 10 minutes, preferably not exceeding five minutes, e.g., a period of 3-5 minutes.

The silicon dioxide precursor is deposited into the trench cavity by a full fill technique, such as chemical vapor deposition, atomic layer deposition, or other vapor-phase contacting of the substrate with the precursor, conducted at low temperature (<400° C.), preferably below 350° C., to cause the silicon dioxide precursor to enter and fill the trench. The precursor composition full filled in the trench is exposed to water or moisture and hydrolyzes, subsequently undergoing a condensation reaction to form the silicon dioxide product material.

The silicon dioxide material deriving from the precursor of the invention next is advantageously subjected to post-cure treatment, to effect densification of the silicon dioxide. The mass of silicon dioxide material in the trench constitutes a bulk mass that is in contact with the wall surfaces and floor surface of the trench, forming a continuous mass in the trench that is homogeneous and substantially void free in character.

Any suitable post-cure treatment may be employed for the formed silicon dioxide material in the trench to densify the silicon dioxide material that has been formed from the precursor by hydrolysis and condensation reactions. Specific post-cure treatment techniques that may advantageously be employed in specific embodiments of the invention include, without limitation, exposure of the flow filled material to oxygen, ultraviolet radiation, and/or low-temperature heating.

FIG. 1 is a schematic representation of a high aspect ratio trench structure including a silicon dioxide full filled trench, as formed by use of a precursor of the invention.

As shown in FIG. 1, the high aspect ratio trench structure 10 includes a microelectronic device substrate 12 with a top surface 14 and a bottom surface 16. The substrate includes a trench 18 bounded by side wall surfaces 20 and floor surface 22. The trench cavity in this structure is filled with a mass of silicon dioxide 24 that is in contact with the wall and floor surfaces 18, 20, 22, and is substantially void-free and of substantially uniform density throughout its bulk volume.

In preferred practice, the substantially void-free character of the silicon dioxide formed in the trench is readily confirmed by porosimetry, permeability criteria, SEM cross-sectioning, or other conventional techniques for morphological characterization to determine presence of voids.

The foregoing precursors and methodology of the invention enable effective formation of full fill trench structures with silicon dioxide that is curable under low temperature conditions to yield silicon dioxide of a substantially void-free condition with substantially uniform density throughout its bulk volume.

Another aspect of the invention relates to a Ge/Si oxide composition for gap filling in applications such as fill of memory device trenches. GeO$_2$ has a much lower viscosity than SiO$_2$. The invention in this aspect contemplates the use of a Si$_x$Ge$_{1-x}$O$_2$ to enable sufficient atomic rearrangement to occur for healing of the seam produced by coalescence of side-wall growth in the trench, thereby removing any non-uniform strain within the gap fill. This in turn enables a uniform removal rate to be achieved, with respect to cleaning chemistry exposure in subsequent processing of the device structure.

In the use of Si$_x$Ge$_{1-x}$O$_2$ for gap filling, the ratio of germanium to silicon in the film is advantageously in a range of from 0.005 to 0.25 (with x having a value in the formula Si$_x$Ge$_{1-x}$O$_2$ of 0.75 to 0.995), in order to appropriately minimize germanium content for achievement of acceptable dielectric properties.

In the use of such Ge/Si oxide compositions, only sufficient flow to fill the seam and remove strain non-uniformity is required, and high temperatures can be tolerated in the curing operation. These characteristics enable the amount of added germanium to be minimized, so that other film properties can be optimized. A preferred germanium precursor for such purpose is selected from among germanium alkoxides: R$_{4-x}$Ge(OR$^1$)$_x$, R$_{4-x}$Ge(NR$^1$R$^2$)$_x$, and R$_{4-x}$GeH$_x$; wherein x=0-4 and each R, R$^1$, R$^2$ is independently selected from among branched and unbranched C$_1$-C$_6$ alkyl, C$_3$-C$_8$ cycloalkyl, and C$_6$-C$_{13}$ aryl.

A preferred embodiment uses the tetra-alkoxygermanes, Ge(OMe)$_4$ (TMOG) or Ge(OEt)$_4$ (TEOG).

Using germanium alkoxides in a tetraethylorthosilicate (TEOS)/ozone (O$_3$) process has the advantage that film smoothness can be substantially improved. This factor is particularly important for gap fill, since the seam width is likely to be dependent on the roughness of the growth surfaces when coalescence occurs, as the sidewall growth elements meet one another.

The invention in another aspect relates to use of suppressors for bottom up gap fill. This aspect of the invention takes advantage of the fact that a deposition process characterized by a higher growth rate at the bottom of the trench than at the upper regions thereof will result in a reduced seam length, even offering the potential for elimination of the seam. The invention therefore contemplates suppression of deposition outside of the trench relative to the bottom of the trench, using a "suppressor" chemical species. The concentration of such suppressor can be reduced within the trench due to slower transport into the trench features relative to transport to the wafer surface. In order to generate low concentrations within the trench, some consumption of suppressor species is required, e.g. by decomposition or reaction in the gas phase or on the surface, such as may be effected by ozone-mediated oxidation.

In the tetraethylorthosilicate (TEOS)/ozone process, addition of methanol can be employed to planarize deposition profiles. Lower deposition rates can occur in very high aspect ratio structures due to accumulation of TEOS/$O_3$ reaction products, which in turn act to suppress growth. The TEOS/$O_3$ reaction products can include acetaldehyde and/or possible oxirane, and active species may include hydrocarbons with carbonyl functionality, as a product of oxidation of alcohols with ozone.

More generally, a wide variety of hydrocarbon species can be employed as suppressors to modify the deposited film profile within a trench. These include hydrocarbons with one or more carbonyl groups and/or one or more hydroxy groups.

As used herein, a "suppressor" is a species that reduces growth rate when introduced with precursor on a substrate.

Figure 2:
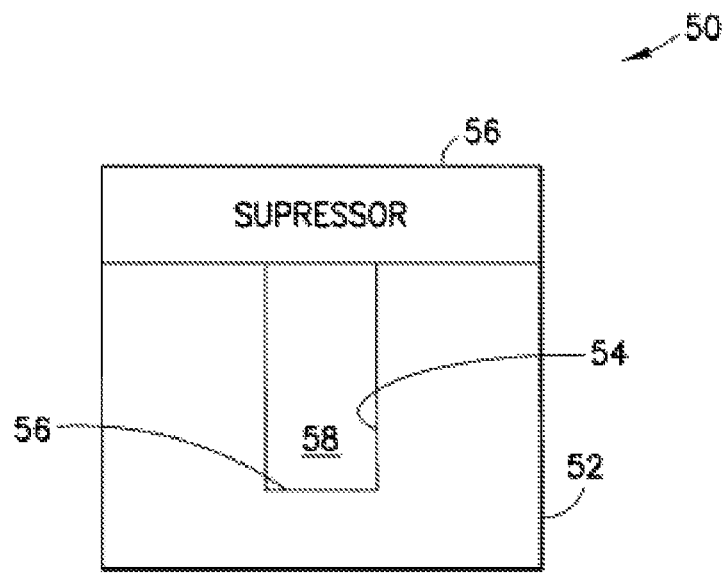
FIGS. 2 and 3 show schematic representations of a microelectronic device structure in which deposition of the trench-filling material is being carried out with suppressor in the deposited fill material, with FIG. 3 showing the effect of suppressor on growth of the oxide material in the trench.

FIG. 2 is a schematic representation of a microelectronic device structure 50 including a substrate 52 in which a trench 58, bounded by sidewalls 54 and floor 56, has been formed.

Figure 3:
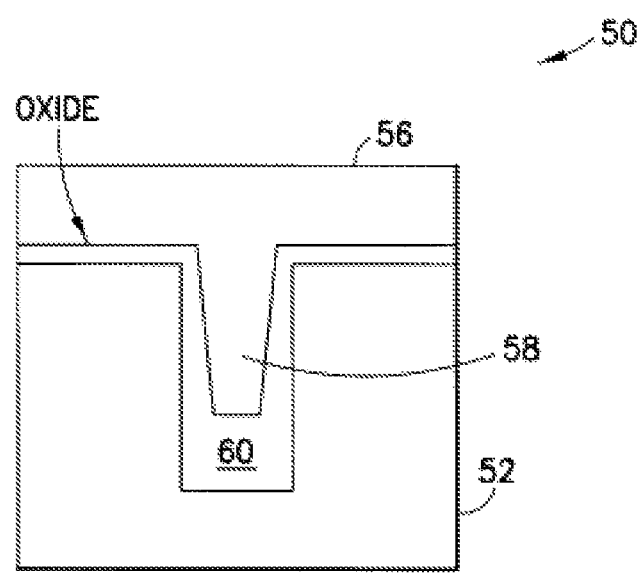

FIG. 2 shows suppressor being in the deposited material 56 including the precursor, and in FIG. 3, the formation of oxide 60 is shown on the main surface of the device structure 50 and in the trench 58. The lower transport rate of suppressor into the trench combined with suppressor consumption produces reduced suppressor concentrations at the bottom of the trench, with correspondingly increased oxide growth. This effect is stronger as the trench closes.

The ideal suppressor has a low gas diffusion rate and high molecular weight, and functions to strongly suppress film growth. The suppressor is consumed to effect depletion thereof, to an extent dependent on the degree of mass transport in the deposition system. Ideally, the suppressor is oxidized by ozone, and undergoes decomposition and reaction with tetraethylorthosilicate. Control of the oxide growth rate in the TEOS/$O_3$ process can be effected by surface reaction control. Preferred suppressor chemistries in specific applications include alcohol and alcohol oxidation products.

In using $GeO_2/SiO_2$ mixtures for gap fill of trenches, advantage is taken of the substantially lower viscosity of $GeO_2/SiO_2$, particularly under annealing conditions. In $GeO_2/SiO_2$ mixtures with minimal $GeO_2/SiO_2$ content, substantial strain relief is achievable as a result of the substantially lower viscosity of $GeO_2/SiO_2$, and at moderate $GeO_2/SiO_2$ content, sufficient flow character is present for healing of narrow seam structures in trench fill material. Germanium alkoxides can be used to achieve good $GeO_2/SiO_2$ mixtures for trench fill. The advantages of germanium in such $GeO_2/SiO_2$ mixtures, include, in relation to $SiO_2$ alone, higher flow at elevated temperatures, reduced moisture content, reduced film roughness and highly uniform chemical reactivity. The presence of germanium is appropriately limited to avoid undue etch rates in exposure to etchants such as hydrogen fluoride, and avoidance of leakage and breakdown strength issues in the cured fill material. Further, it may be desirable to limit or even avoid hydrogen environments in annealing operations, in order to avoid reduction of $GeO_2/SiO_2$ to GeO.

Reactions involved in sol-gel solution chemistry for formation of oxide fill material are set out below, including the reaction involved in the hydrolysis of TEOS:

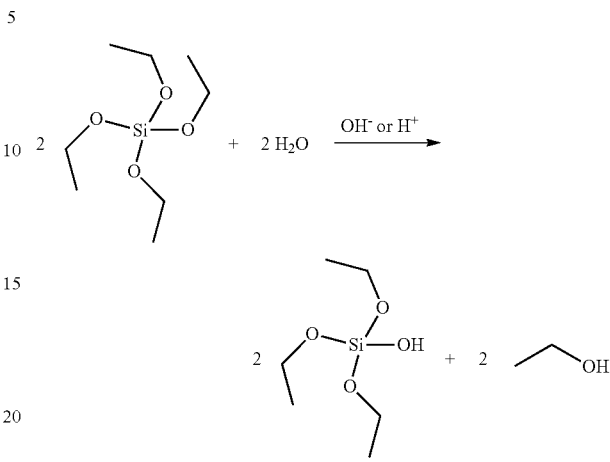

and (poly) condensation of silanols:

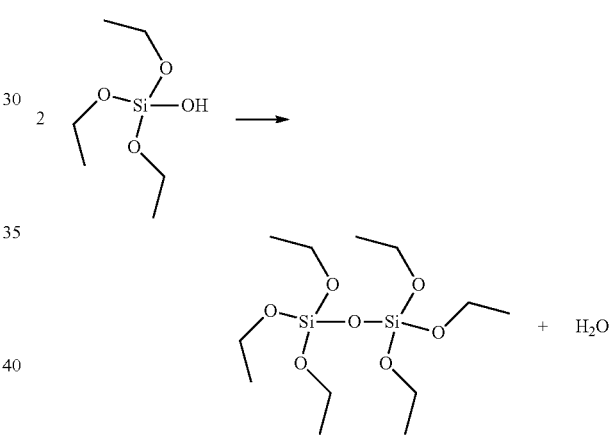

In this reaction scheme, for every silanol bridge formed, one water molecule is consumed. The gel structure is dependent on reactant concentrations of TEOS and water, as well as pH of the deposited fill material. In acidic solutions, hydrolysis reaction tends to go to completion and less cross-linked chains are formed, with reesterification (reverse hydrolysis) being occasionally observed. In basic solution, more highly cross-linked structures are formed, with higher water concentrations promoting hydrolysis and impeding condensation, resulting in higher cross-linked density in the oxide material.

Concerning acid and base catalyzed hydrolysis, acid catalyzed hydrolysis proceeds by the following electrophilic mechanism involving $H_3O^+$:

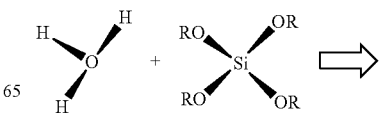

-continued

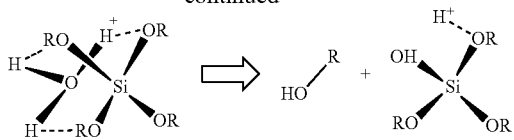

and base catalyzed hydrolysis proceeds by a nucleophilic reaction mechanism according to the following reaction:

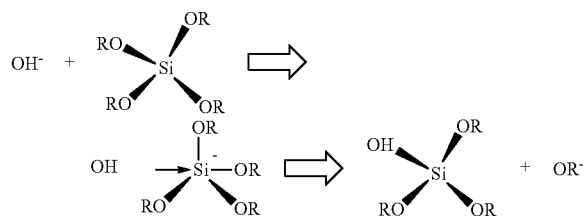

The lower electron density on the silicon atoms as a result of silanol formation, in relation to alkoxy groups, produces a preferred attack of silicon centers with more silanol groups, in base catalyzed systems, and a preferred attack of silicon centers with more alkoxy groups, in acid catalyzed systems. Accordingly, there is a preference for chain extension in acidic solutions, and a preference for cross-linking in basic solutions.

In the TEOS/ozone system for deposition of oxide film material, the TEOS/ozone reaction products or oxidation products of the alkoxy ligand are set out in Table 1 below:

TABLE 1

| Species | Name |
|---|---|
| $CH_3COOH$ | acetic acid |
| $CH_3CHO$ | acetaldehyde |
| HCOOH | formic acid |
| $CH_2O$ | formaldehyde |
| CO | carbon monoxide |
| $CO_2$ | carbon dioxide |
| $H_2O$ | water |
| $\equiv$SiOH | Silanol |

In the TEOS/ozone process, alcohol addition yields enhanced flow characteristics, particularly when methanol is utilized. In the alcohol oxidation reaction, one equivalent of water and one equivalent of carboxylic acid are formed after double oxidation of the primary alcohol:

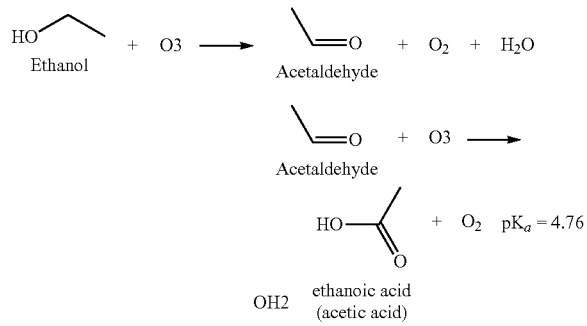

Alcohol addition in the TEOS/ozone process can utilize any suitable alcohol species, with the efficacy of specific alcohols being readily empirically determinable within the skill in the art, based on the disclosure herein. Alcohols such as methanol, formic acid, acetic acid and propionic acid may be used in specific embodiments of the invention. More generally, hydroxy-functional compounds may be used in the $TEOS/O_3$ process to enhance the character of the trench fill operation.

In specific implementations, hydroxy-functional species can include diols, e.g., ethylene glycol, and halogenated alcohols such as 2,2,2-tricholoroethanol.

Dicarboxylic acids can be formed from diols, by reactions such as the following

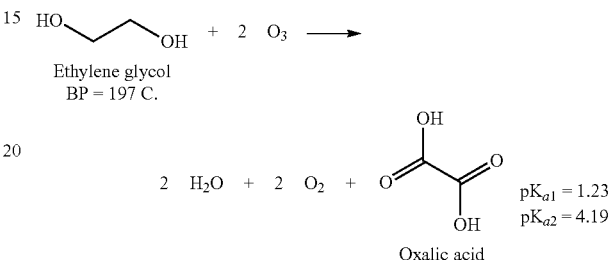

Such use of polyol species produces stronger acid than the acid product formed from primary alcohols. Even stronger carboxylic acids can be formed from oxidation of halogenated alcohols, e.g., as shown by the following reaction. The $pK_a$ of trichloracetic acid is 0.77.

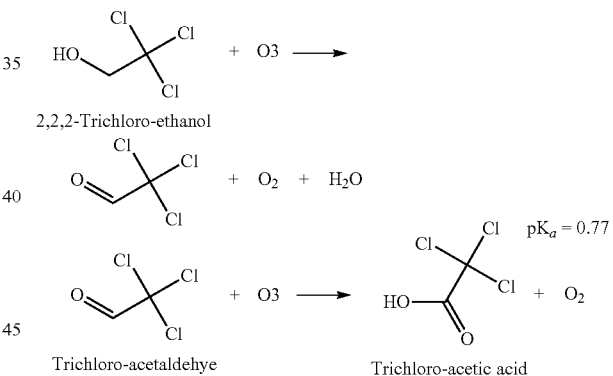

Thus, the invention achieves improved gap filling of trench structures by use of germanium and silicon oxide mixtures, as well as by use of alcoholic or other suppressor species to avoid or minimize seam formation issues in the fill process.

The invention therefore overcomes the problems associated with the TEOS/ozone process in respect of seam formation in trench structures, particularly those with high aspect ratios.

More generally, the chemistry of silicon dioxide synthesis from alkoxide silicon precursors in aqueous solutions is fairly well understood. In the sol-gel process, the hydrolysis of TEOS can be either base or acid catalyzed to form a silanol group and two equivalents of ethanol. In a subsequent reaction step, two silanols condense to form a siloxane bridge and liberate one equivalent of water. After condensation, there are generally some remaining silanols and possibly unreacted alkoxy groups and reaction products. The result is a semi-solid mixture that is referred to as a gel. If SiO$_2$ is desired, the gel then is heated to remove byproducts and allow further condensation (calcination). The final structure, with respect to bond angles and defects, is determined by the solution pH, water and TEOS concentrations and calcination conditions.

The hydrolysis and condensation of TEOS and solutions proceeds by an electrophilic reaction mechanism in acid catalyzed solutions, as opposed to nucleophilic reaction in base catalyzed solutions. One consequence of this is that alkoxy groups on less hydrolyzed silicons are less stable with respect to condensation than those on more hydrolyzed silicon centers. This favors formation of chain structures. Conversely, base catalyzed condensation more readily occurs with silicon centers that have been hydrolyzed. This results in formation of more fully hydrolyzed species before condensation and therefore more cross-linking.

Water is consumed during hydrolysis and liberated during condensation. Accordingly, higher water concentrations promote hydrolysis and impede condensation. The result is higher cross-link density.

In the TEOS/ozone process, film formation also occurs by silanol formation followed by condensation of silanol groups to form siloxane bridges. Oxidation of alkoxy groups is also present (producing acetaldehyde, formaldehyde, CO, CO$_2$, and silanol groups). The presence of water and acid in TEOS/ozone processes affords the possibility of employing hydrolysis reactions to form SiO$_2$ films.

Oxidation of alcohol added to the TEOS/ozone process results in the presence of carboxylic acids. The acids formed from smaller primary alcohols have lower pK$_a$ and may be more effective in catalyzing hydrolysis.

Accordingly, species that oxidize in the presence of ozone can be used to control the chemical reactions during a TEOS/ozone process. For example, double oxidation of alcohols produces both water and a carboxylic acid (acetic acid in the case of ethanol). Addition of the intermediate (acetaldehyde) can produce acid without forming water, and therefore can be employed to control the acid/H$_2$O ratio.

This has some advantages over direct addition of water and acid. Stable mixtures of alkoxide and alcohol/aldehydes or other organic species can be formed, whereas mixtures of acids and/or water and alkoxides will react over time. Liquid mixtures can allow for more accurate control of the ratio of reactant, and also allow in-situ generation of species that may not be stable enough for efficient delivery. Use of an aldehyde does not add water, and it therefore requires water from the condensation reaction to enable further hydrolysis to take place. Another potential advantage is flexibility in avoiding less safe and less stable alkoxides. For example, TEOS is preferred over tetramethoxysilane (TMOS), because TMOS is more toxic and more reactive to atmospheric contamination. TMOS, however, has better flowability. If an important difference is the presence of formic acid as the product of TMOS decomposition, then a similar result could be achieved with TEOS and methanol.

Stronger acids can more readily catalyze hydrolysis. These stronger acids can be formed from ethylene glycol or from halogenated alcohol such as trichloroethanol or trifluoroethanol. Oxidation of ethylene glycol results in oxalic acid (pK$_a$=1.23), and oxidation of trichloroethanol and trifluoroethanol results in trichloroacetic acid and trifluoroacetic acid, respectively (pK$_a$=0.77 and 0.30, respectively).

For single solution approaches, the additive employed in the TEOS/ozone process must be soluble in the alkoxide. In some cases, a co-solvent may be required to form a solution. For example, TEOS and ethylene glycol have very limited mutual solubility, but the addition of isopropyl alcohol allows the solution to be formed.

It will therefore be seen that the efficacy of the TEOS/ozone process can be substantially increased by addition of additives as disclosed herein.

The features and advantages of the invention are more fully shown by the following non-limiting examples of gap fill processes.

Gap Fill Process Examples

Deposition was carried out in an Applied Materials P5000 reactor with the TEOS/ozone process. Void fraction was found by measuring the void area in SEM cross-sections after cleaving and staining in 200:1 H$_2$O:HF. Stain times were chosen to result in 5 nm removal of SiO$_2$ from blanket film witness pieces deposited in the same run. Results are set out below in the tables for Examples 1, 2 and 3.

Example 1

| Parameter | Value |
| --- | --- |
| TEOS first | Stabilize in TEOS 90 seconds before deposition |
| Pressure | 500 Torr |
| Susceptor Temperature | 425 C. |
| Formulation: IPA/Methanol/TEOS | 4:4:1 |
| Liquid Flow | 0.433 cc/min |
| Ozonator feed gas | 10SLM O2 + 100 ppm N2 |
| Ozone Concentration | 12% |
| Susceptor spacing | 420 mils |
| Void % Annealed (800 C. 30 min) | 10.57 |
| Void % As deposited | 6.88 |
| Rate | 4.5 A/sec |
| time for 2000A | 444 seconds |

Example 2

| Parameter | Value |
| --- | --- |
| TEOS first | Stabilize in TEOS 90 seconds before deposition |
| Pressure | 500 Torr |
| Susceptor Temperature | 425 C. |
| Formulation: IPA:Ethanol:TMOG:TEOS | 0.05:0.10:0.05:1 |
| Liquid Flow | 0.35 cc/min |
| Ozonator feed gas | 10SLM O2 + 100 ppm N2 |
| Ozone Concentration | 15% |
| Susceptor spacing | 420 mils |
| Ge content (film) | 2 atomic % |
| Void % Annealed (800 C. 30 min) | 3.59% |
| Void % As deposited | 1.86 |
| Rate | 10 A/sec |

Example 3

| Parameter | Value |
| --- | --- |
| TEOS first | Stabilize in TEOS 90 seconds before deposition |
| Pressure | 500 Torr |
| Susceptor Temperature | 425 C. |
| Formulation: IPA:Ethanol:TMOG:TEOS | 0.05:0.10:0.20:1 |

-continued

| Parameter | Value |
| --- | --- |
| Liquid Flow | 0.35 cc/min. |
| Ozonator feed gas | 10SLM O2 + 100 ppm N2 |
| Ozone Conc | 15% |
| Susceptor spacing | 420 mils |
| Void % Annealed (800 C. 30 min) | 1.34% |
| Void % As deposited | 0.71 |
| Rate | 6 A/sec |

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A full fill trench structure comprising a microelectronic device substrate having a high aspect ratio trench therein and a full filled mass of silicon dioxide in said trench, said silicon dioxide being of a substantially void-free character and having a substantially uniform density throughout its bulk mass, as formed by full fill of the trench with a silicon dioxide precursor composition, and hydrolysis and condensation chemical reactions of the precursor composition to form the silicon dioxide full filled mass in the trench.

2. The full fill trench structure of claim 1, wherein said precursor composition comprises a precursor silicon compound selected from the group consisting of:
   (i) aminosilanes of the formula $(R^1R^2N)_{4-x}SiR_x$, wherein x is an integer having a value in a range of from 0 to 3, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;
   (ii) alkoxysilanes of the formula $(RO)_{4-x}SiR^1_x$, wherein x is an integer having a value in a range of from 0 to 3, and each R and $R^1$ is independently selected from among hydrogen, branched and unbranched $C_1$-$C_6$ alkyl, $C_3$-$C_8$ cycloalkyl, and $C_6$-$C_{13}$ aryl;
   (iii) alkoxydisilanes of the formula $(RO)_{3-x}R^1_xSi$—Si$(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;
   (iv) aminodisilanes of the formula $(R^1R^2N)_{3-x}R_xSi$—Si$(NR^1R^2)_{3-x}R_x$, wherein x is an integer having a value in a range of from 0 to 2, and each R, $R^1$, and $R^2$ is independently selected from among hydrogen, branched or unbranched $C_1$-$C_6$ alkyl, $C_3$-$C_8$ cycloalkyl, and $C_6$-$C_{13}$ aryl;
   (v) aminodisiloxanes of the formula $(R^1R^2N)_{3-x}R_xSi$—O—Si$(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;
   (vi) alkoxydisiloxanes of the formula $(RO)_{3-x}R^1_xSi$—O—Si$(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;
   (vii) aminodisilazanes of the formula $(R^1R^2N)_{3-x}R_xSi$—NH—Si$(NR^1R^2)_{3-x}R_x$, wherein x is an integer having a value in a range of from 0 to 2, and each R, $R^1$, and $R^2$ is independently selected from among hydrogen, branched and unbranched $C_1$-$C_6$ alkyl, $C_3$-$C_8$ cycloalkyl, and $C_6$-$C_{13}$ aryl;
   (viii) alkoxydisilazanes of the formula $(RO)_{3-x}R^1_xSi$—NH—Si$(OR)_{3-x}R^1_x$, wherein x is an integer having a value in a range of from 0 to 2, and each R and $R^1$ is independently selected from among hydrogen, branched and unbranched $C_1$-$C_6$ alkyl, $C_3$-$C_8$ cycloalkyl, and $C_6$-$C_{13}$ aryl;
   (ix) chloroaminosilanes of the formulae $Cl_{4-x}Si(NR^1R^2)_x$, wherein x is an integer having a value in a range of from 0 to 3, $(R^1R^2N)_{3-x}Cl_xSi$—Si$(NR^1R^2)_{3-x}Cl_x$, wherein x is an integer having a value of 1 or 2, $(R^1R^2N)_{3-x}Cl_xSi$—O—Si$(NR^1R^2)_{3-x}Cl_x$, wherein x is an integer having a value of 1 or 2, and $(R^1R^2N)_{3-x}Cl_xSi$—NH—Si$(NR^1R^2)_{3-x}Cl_x$, wherein x is an integer having a value of from 1 or 2, and each $R^1$ and $R^2$ is independently selected from among hydrogen, branched and unbranched $C_1$-$C_6$ alkyl, $C_3$-$C_8$ cycloalkyl, and $C_6$-$C_{13}$ aryl;
   (x) cyclosiloxanes and cyclosilazanes of the formulae:

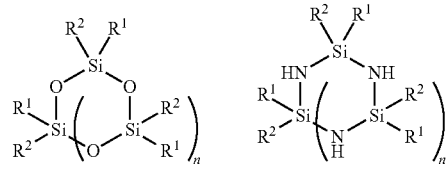

wherein n is an integer having a value in the range of from 0 to 4, and each $R^1$ and $R^2$ is selected from among hydrogen, branched and unbranched $C_1$-$C_6$ alkyl, $C_3$-$C_8$ cycloalkyl, $C_6$-$C_{13}$ aryl, $C_1$-$C_6$ dialkylamino, and $C_1$-$C_6$ alkoxide;
   (xi) linear polysiloxanes and polysilazanes;
   (xii) silicon compounds of general formulae $R_{4-x}SiL_x$ wherein x is an integer having a value of from 1 to 3, and $L_{3-x}R_xSi$-$SiL_{3-x}R_x$ wherein x is an integer having a value of from 0 to 2, L is selected from isocyanato (NCO), methylethylketoxime ($R^1R^2C$=N—O—), trifluoroacetate ($CF_3OCO$), triflate ($CF_3SO_3$), acyloxy (ROCO), β-diketonate ($R^1COCHCOR^2$), β-diketiminate ($R^1CNR^2CHCOR^3$), β-diiminate ($R^1CNR^2CHCNR^2R^3$), amidinate ($RC(NR^1)_2$), guanidinate {$(R^1R^2N)C(NR^3)_2$}, alkylamino ($NR^1R^2$), hydride, alkoxide (RO), and formato (HCOO) and each R, $R^1$, $R^2$, and $R^3$ is independently selected from among hydrogen, branched and unbranched $C_1$-$C_6$ alkyl, $C_3$-$C_8$ cycloalkyl, and $C_6$-$C_{13}$ aryl;
   (xiii) oxiranylsilanes of the formulae

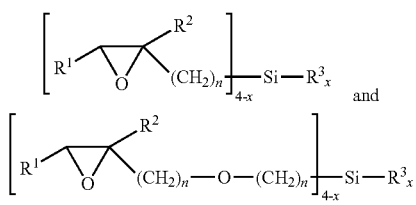

and wherein x is an integer having a value in a range of from 0 to 3, n is an integer having a value in a range of 0 to 3, and each $R^1$, $R^2$, and $R^3$ is independently selected from among hydrogen, branched and unbranched $C_1$-$C_6$ alkyl, $C_3$-$C_8$ cycloalkyl, $C_6$-$C_{13}$ aryl, $C_1$-$C_6$ alkylamino, and $C_1$-$C_6$ alkoxide;

(xiv) silicon precursors containing ethylacetate groups, of the formula $(ROCOCH_2CH_2)_xSi(OR^1)_{4-x}$, wherein x is an integer having a value in a range of from 1 to 4, and each of R and $R^1$ is independently selected from among hydrogen, branched and unbranched $C_1$-$C_6$ alkyl, $C_3$-$C_8$ cycloalkyl, and $C_6$-$C_{13}$ aryl;

(xv) $(tBuHN)_2(H_2N)Si$—$Si(NH_2)(NHtBu)_2$ wherein tBu is tertiary butyl; and (xvi) pre-polymer partial hydrolysis products of the foregoing compounds (i)-(xv).

3. The full fill trench structure of claim 2, wherein said precursor silicon compound is hydrolyzed to a sol comprising $Si(OH)_4$ and said sol is condensed by condensation reaction in the presence of a condensing agent selected from the group consisting of ammonia, amines, disilanes, silicon tetrachloride, and chlorine-substituted compounds.

4. The full fill trench structure of claim 2, wherein said precursor silicon compound is hydrolyzed in exposure to at least one agent selected from the group consisting of moisture, water and protic solvents.

5. The full fill trench structure of claim 2, wherein said precursor silicon compound comprises aminosilane of the formula $H_{4-x}Si(NR_2)_x$ wherein x has the same integer value of from 1 to 3, and a chloroaminosilane is added to said aminosilane in a catalytically effective amount to catalyze condensation reaction of said aminosilane.

6. The full fill trench structure of claim 5, wherein said chloroaminosilane comprises $Cl_{4-x}Si(NR_2)_x$, wherein x is an integer having a value in a range of from 1 to 3.

7. The full fill trench structure of claim 6, wherein said chloroaminosilane is added in an amount of from 0.05-5% weight percent, based on total weight of said chloroaminosilane and said aminosilane.

8. The full fill trench structure of claim 2, wherein said precursor silicon compound comprises an alkoxysilane, and a chloro-substituted silane or chloro-substituted disilane is added to said alkoxysilane in a catalytically effective amount to catalyze condensation reaction of said alkoxysilane.

9. The full fill trench structure of claim 8, wherein said chloro-substituted silane or chloro-substituted disilane is added in an amount of from 0.05-5% weight percent, based on total weight of said alkoxysilane and said chloro-substituted silane or chloro-substituted disilane.

10. The full fill trench structure of claim 2, wherein said precursor silicon compound comprises hexaethylaminodisilane.

11. The full fill trench structure of claim 2, wherein said precursor silicon compound comprises $(tBuHN)_2(H_2N)Si$—$Si(NH_2)(NHtBu)_2$.

12. The full fill trench structure of claim 2, wherein said precursor silicon compound comprises $Si(NMe_2)_4$.

13. The full fill trench structure of claim 1, wherein said silicon dioxide has been further processed for densification thereof after the hydrolysis and condensation chemical reactions.

14. The full fill trench structure of claim 13, wherein said densification is effected by exposure of the silicon dioxide to at least one of oxygen exposure, ultraviolet radiation, and low-temperature heating.

15. The full fill trench structure of claim 1, wherein the silicon dioxide precursor composition includes a composition selected from the group consisting of:

(a) precursor compositions of the formula $(RO)_{4-x}SiH_x$, wherein x is an integer having a value of from 0 to 3;

(b) precursor compositions of the formula $H_{4-x}Si(NR_2)_x$, wherein x is an integer having a value of from 1 to 4;

(c) precursor compositions of the formula $H_{4-x}Si(NHR)_x$, wherein x is an integer having a value of from 1 to 4;

(d) precursor compositions of the formula $(RO)_{3-x}H_xSi$—$Si(OR)_{3-x}H_x$, wherein x is an integer having a value of from 0 to 2;

(e) precursor compositions of the formula $(NR^1R^2)_{3-x}H_xSi$—$Si(NR^1R^2)_{3-x}H_x$ wherein x is an integer having a value in a range of from 0 to 2, and each R, $R^1$, $R^2$ is independently selected from among hydrogen, and branched and unbranched $C_1$-$C_6$ alkyl.

16. The full fill trench structure of claim 1, wherein the silicon dioxide precursor composition includes a composition selected from the group consisting of silicon precursors in which the silicon atom is coordinated with ligands including at least one of isocyanato, methylethylketoxime, trifluoroacetate, triflate ($F_3SO_3H$), alkylamines, hydrides, alkoxides, disilanes, and formato.

* * * * *